US006310341B1

(12) United States Patent
Todokoro et al.

(10) Patent No.: US 6,310,341 B1
(45) Date of Patent: Oct. 30, 2001

(54) PROJECTING TYPE CHARGED PARTICLE MICROSCOPE AND PROJECTING TYPE SUBSTRATE INSPECTION SYSTEM

(75) Inventors: Hideo Todokoro, Nishitama-gun; Tohru Ishitani, Sayama; Yasutsugu Usami, Toshima-ku; Shunroku Taya, Mito; Hiroyuki Shinada, Chofu; Taku Ninomiya; Tsuyoshi Ohnishi, both of Hitachinaka, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/253,456

(22) Filed: Feb. 22, 1999

(30) Foreign Application Priority Data

Feb. 23, 1998 (JP) .................................. 10-040120

(51) Int. Cl.$^7$ .............................. H01J 49/44; H01J 37/26
(52) U.S. Cl. ........................................... 250/305; 250/310
(58) Field of Search ..................................... 250/305, 310

(56) References Cited

U.S. PATENT DOCUMENTS

| 2,901,627 | * | 8/1959 | Wiskott et al. | 250/310 |
| 4,810,879 | * | 3/1989 | Walker | 250/305 |
| 5,502,306 | * | 3/1996 | Meisburger et al. | 250/310 |
| 5,506,414 | * | 4/1996 | Coxon | 250/310 |
| 6,066,852 | * | 5/2000 | Taya et al. | 250/396 ML |

FOREIGN PATENT DOCUMENTS

WO 96/02935 * 2/1999 (WO).

OTHER PUBLICATIONS

"Surface Studies by Low–Energy Electron Microscopy (LEEM) and Conventional UV Photoemission Electron Microscopy (PEEM)" in Ultramicroscopy, 31 (1989), pp. 49–57.

* cited by examiner

Primary Examiner—Jack Berman
(74) Attorney, Agent, or Firm—Kenyon & Kenyon

(57) ABSTRACT

An irradiation electron beam emitted from an electron gun is deflected by an energy filter, and passes through a first projective lens and an objective lens, and then irradiated onto a sample to produce secondary electrons. The secondary electron beam accelerated by a negative voltage applied to the sample passes through the objective lens and the first projective lens, and deflected by the energy filter to be energy dispersed. Only the secondary electrons having a specified energy pass through energy selecting aperture, and further pass through a second projective lens to form a projected image of the secondary electrons on an imager. Such an electron-optical system may be used for dimension evaluation or inspection of semiconductor substrates.

27 Claims, 7 Drawing Sheets

PRIOR ART

PROJECTING TYPE CHARGED PARTICLE MICROSCOPE AND PROJECTING TYPE SUBSTRATE INSPECTION SYSTEM

BACKGROUND OF THE INVENTION

The present invention relates to a projecting type charged particle microscope and a projecting type substrate inspection system, and particularly to a projecting type charged particle microscope and a projecting type substrate inspection system in which a substrate is irradiated with an irradiation beam and charged particles generated from the surface of the substrate by the irradiation are projected to form an image.

A method of observing a fine structure using charged particles is a scanning type electron microscope (a scanning electron microscope) in which an inspection sample is scanned with a finely focused electron beam, and electrons characterizing the sample such as secondary electrons, reflected electrons, etc. generated from the sample by the electron beam scanning are detected, and then an image expressing the sample shape is displayed on a CRT (a cathode lay tube) using the detected signal as the brightness modulation signal. The scanning electron microscope is used for micro-structure observation or dimension measurement of workpieces under process working in the semiconductor industry. At the present time, the scanning electron microscope is used for shape inspection and dimension measurement of finely worked samples.

Dimension measurement using such a scanning electron microscope has been already automated, and the automatic measuring system has a processing speed of about several ten wafers (samples) per hour. However, this capacity is based on a case where the dimension measurement is performed on several ten positions per one wafer. If the number of measuring positions is increased, for example, ten times as many as the above-mentioned number or if the area of worked shape inspection is expanded to over the whole surface of the wafer, the process capacity, that is, the throughput is extremely reduced.

SUMMARY OF THE INVENTION

An object of the present invention is to provide a projecting type charged particle microscope and a projecting type substrate inspection system which are suitable for improving the throughput.

According to one aspect, the present invention is characterized by a projecting type charged particle microscope comprising an irradiating means for irradiating a substrate with an irradiation beam; a projecting-and-image-forming means for projecting charged particles generated from a surface of the substrate by the irradiation to form an image; an image-taking means for taking the image-formed charged particle image; and a position-controlled sample stage for holding the substrate and moving the substrate in X- and Y-directions.

According to another aspect, the present invention is characterized by a projecting type substrate inspection system comprising an irradiating means for irradiating a substrate with an irradiation beam; a projecting-and-image-forming means for projecting charged particles generated from a surface of the substrate by the irradiation to form an image; an image-taking means for taking the image-formed charged particle image; a sample stage for holding the substrate and moving the substrate in X- and Y-directions; and a means for performing alignment of the substrate.

According to a further aspect, the present invention is characterized by a projecting type substrate inspection system comprising an irradiating means for irradiating a substrate with an irradiation beam; a projecting-and-image-forming means for projecting charged particles generated from a surface of the substrate by the irradiation to form an image; an image-taking means for taking the image-formed charged particle image; and a laser micrometer for determining a position of the substrate in association with the irradiation beam.

DESCRIPTION OF THE PREFERRED EMBODIMENTS

Figure 1:
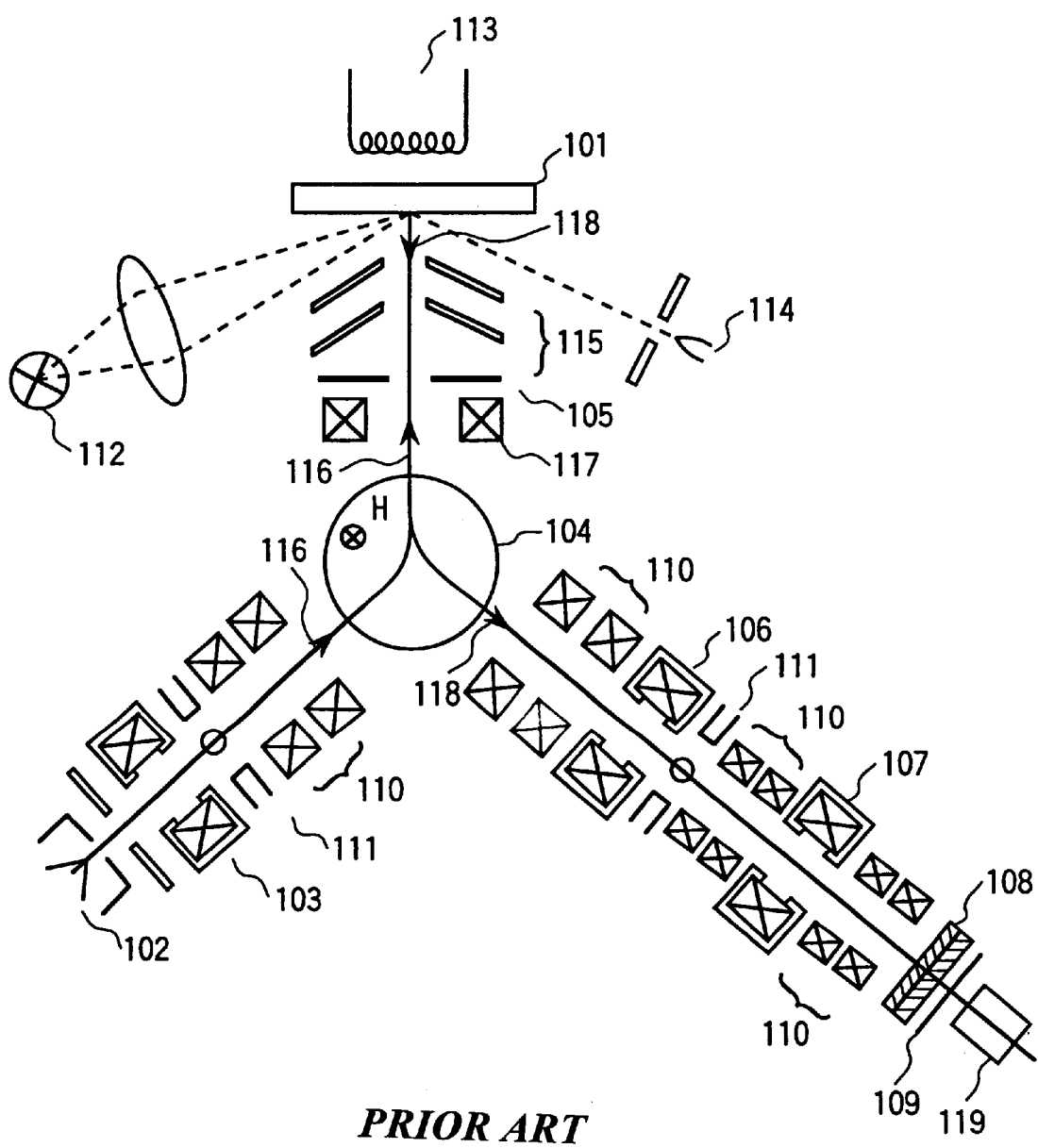
FIG. 1 is a view showing an electron-optical system of a conventional projecting type electron microscope.

As described previously, the common scanning electron microscope used for dimension measurement has a processing speed of about several ten wafers (samples) per hour.

However, this capacity is based on a case where the dimension measurement is performed on several ten positions per one wafer. If the number of measuring positions is increased, for example, ten times as many as the above-mentioned number or if the area of worked shape inspection is expanded to over the whole surface of the wafer, the process capacity, that is, the throughput is extremely reduced.

This limit in the processing capacity is attributed to the basic principle of the scanning electron microscope which scans a sample with an electron beam. The present invention is suitable for improving the processing capacity, that is, the throughput. In order to improve the processing capacity, it is necessary to change the image formation from the scanning image forming type to a projecting image forming type in which an image is formed in parallel. This is because the projecting type image formation can attain improvement of throughput (throughput improving coefficient as the principle) equivalent to the number of pixels in a case of forming a two-dimensional image by the scanning type image formation. Assuming a two-dimensional image is formed, for example, with 500×500 pixels in the scanning type, the corresponding throughput in the projecting type becomes 250,000 times as large as that in the scanning type (the time required for observation is reduced to one over one-hundred-twenty-thousands). Although no apparatus satisfying this object has been developed yet, a technology in regard to this is proposed in an article entitled "Surface studies by low-energy electron microscopy (LEEM) and conventional UV photoemission electron microscopy (PEEM)" in Ultramicroscopy, 31 (1989), pp. 49–57.

An outline of this technology will be described below, referring to FIG. 1. An electron beam 116 accelerated by an electron gun 102 enters into a separator 104 through a lens 103 and a deflection system 110. A magnetic field H in a direction normal to the plane of the figure is applied to the separator 104. Therefore, the electron beam 116 is deflected to be directed to a sample 101 through an objective lens 117.

A negative voltage is applied to the sample, not shown in the figure. Therefore, the electron beam 116 is decelerated between the sample 101 and a cathode lens 115. By the deceleration, energy of the electron beam 116 with which the sample 101 is to be irradiated is adjusted below 100 eV. An electron beam 118 back scattered by the sample 101 is accelerated by the cathode lens 115, and enters in the separator 104 through the objective lens 117. Since the traveling direction of the electron beam 118 is opposite to that of the electron beam 116, the electron beam 118 is deflected to the direction opposite to the electron gun 102 by the separator 104. The deflected electron beam 118 is magnified by an intermediate lens 106 and a projective lens 107, and imaged on a surface of an MCP (a multichannel plate image intensifier) 108. The electron image amplified by the MCP 108 accelerated toward a fluorescent screen 109 to form a on the fluorescent screen 109. The two-dimensional optical image is observed by being taken by an image tube 119.

Adjustment of focusing is performed using the objective lens 117, and adjustment of magnification is performed using the intermediate lens 106 and the projective lens 107.

Although the above explanation is on the case where back-scattered electrons are imaged, it is possible to observe secondary electrons by irradiation electrons from an auxiliary electron gun 114 onto the sample 101 from an oblique direction and accelerating the generated secondary electrons using the cathode lens 115. Numeral 112 designates a halogen lump. The sample 101 is irradiated with the light from the halogen lump so as to excites electrons. The excited electrons are projected to form an image.

In FIG. 1, numeral 111 designates quadrupoles, numeral 5 an aperture, and numeral 113 an electron bombardment heater. The deflection systems 110 are arranged in the front stage of the intermediate lens 106 and in the front and rear stages of the projective lens 107.

The sample 101 is irradiated with an electron beam having an energy below 100 V, and back scattered electrons obtained from the sample 101 by the irradiation are used to form an image of projecting type. Observation of the image of projecting type using the back scattered electrons having an energy below 100 V displays its power in observation of crystal state of the surface of the sample 101. That is, the observation is suitable for observing a very flat surface of a sample at size of the order of atom. However, in a case of a sample of substrate such as a semiconductor wafer which has a roughness of the order of micrometer, an image is affected by an electric field produced by the roughness of the sample surface Consequently, the object to be observed is limited to only a sample having a flat surface.

Therefore, when a sample of substrate such as a semiconductor wafer is observed, the effect of the electric field produced roughness of the sample surface needs to be reduced by increasing the acceleration voltage (energy) of the irradiation electron beam.

On the other hand, since an insulating material is used in the sample of substrate such as a semiconductor wafer, the energy of the electron beam with which the sample is to be irradiated is limited within a range of 500 V to 1 kV at which the insulating material is not charged. In addition, since both of the secondary electrons and the back scattered electrons produced by the electron beam are widely deviated in energy at emitting, there is a problem of difficulty in improving the resolution.

Further, in order to observe the inside of a hole in the sample, it is necessary that the direction of the incident electron beam with which the sample is to be irradiated is normal to the sample surface.

In the embodiment of the present invention, the following two points are taken into consideration in order to solve the above-described problems. The first point is that an electron beam with which the sample is irradiated to generate secondary electrons is launched into the sample with the incident angle normal to the sample surface. The second point is that the projecting-and-image-forming optical system for secondary electrons and back scattered electrons comprises an energy filter, and the energy filter separates the secondary electrons and the back scattered electrons and at the same time limits the energy distribution in order to improve the resolution of the projected image.

Figure 2:
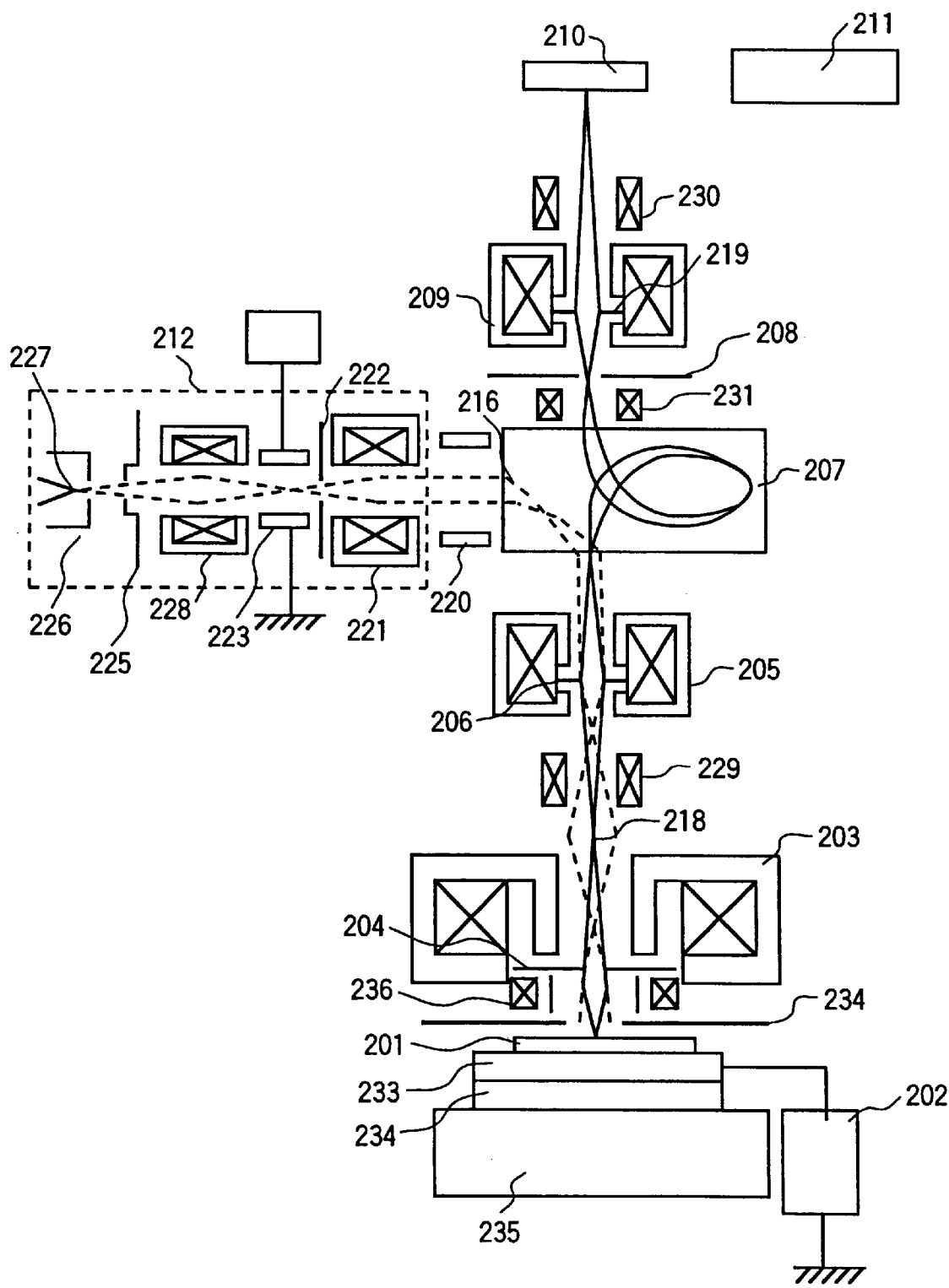
FIG. 2 is a conceptual view showing the essential part mainly composed of an electron-optical system in an embodiment of an electron-optical system in accordance with the present invention.

FIG. 2 shows the essential part mainly composed of an electron-optical system in an embodiment of an electron-optical system in accordance with the present invention. A sample holder 233 is mounted on a sample stage 235 movable in the X- and Y-directions through an insulating plate 234, and a sample 201 of substrate such as a semiconductor wafer is mounted on the sample holder. A negative voltage of 10 kV is applied to the sample holder 233 from a power source 202. Since the sample 201 is in contact with the sample holder 233 on the reverse surface side, the negative voltage of 10 kV is also applied to the sample 201. Thereby, an electric field is produced on the obverse surface.

An irradiated electron beam 216 emitted from an electron gun 212 is deflected by a magnetic field of an energy filter 207, and impinges on the sample 201 through a first projective lens 205 and an objective lens 203. The irradiated electron beam 216 has an acceleration voltage of 11 kV, and after passing through the first projective lens 295 and the objective lens 203 the irradiated electron beam 216 is decelerated to an acceleration voltage of 1 kV by the negative voltage of 10 kV applied to the sample 201. When the acceleration voltage of the irradiated electron beam 216 is 1 kV, the sample 201 can be observed without being charged even if the sample is an insulation substance such as semiconductor.

Secondary electrons are produced from the sample 201 by the irradiation of the sample with the irradiation electron beam 216 decelerated to 1 kV. The produced secondary electrons are accelerated by the negative voltage applied to the sample 201, that is, by the electric field produced on the surface of the sample 201 to form a secondary electron beam 218. The secondary electron beam 218 enters into the energy filter 207 through the objective lens 203 and the first projective lens 205. The secondary electron beam 218 is deflected in one turn by the magnetic field of the energy filter 207, as shown in the figure, to cause a larger energy dispersion. An energy selecting aperture 208 is arranged at the exit of the energy filter 207 to select secondary electrons having a specified energy out of the energy dispersed secondary electrons. That is, although the secondary electrons produced from the sample 201 are distributed within an energy range of 0 to 50 V, only secondary electrons having energies within a part of the range of the energy distribution can pass through the energy selecting aperture 208. In detail, only secondary electrons having energies within a range of, for example, 1 V with respect to 2 V at the peak position of the energy distribution as the center pass through the energy selecting aperture 208. The secondary electron beam 218 passed through the energy selecting aperture 208 projects a secondary electron image onto an imager 210 through a second projective lens 209. The imager 210 is composed of an MCP, a fluorescent screen and an image tube, as shown in FIG. 1. In FIG. 2, these units are unified and shown as the imager 210.

The objective lens 203, the first projective lens 205 and the second projective lens 209 compose a magnetic field type magnifying projective lens system. The projective imaging lens composed of these lenses has a straight line axis along which electrons produced from the sample 201 pass, and this axis intersects with an axis of the irradiation electron beam 216 emitted from the electron gun 210 at right angle. The intensity distribution (secondary electron image) of the secondary electrons excited by the irradiated electron beam 216 is magnified by the magnifying projective lens system to be projected to the imager 210, and then displayed on a CRT 211. The two stages of projective lenses may be changed to three or more stages of projective lenses in order to obtain higher magnification. Apertures 204, 206 and 219 for limiting aperture angle are arranged in the objective lens 203, the first projective lens 205 and the second projective lens 209, respectively.

Although the secondary electrons are imaged in the embodiment, it is possible that the sample 201 is irradiated with an irradiation electron beam of 1 kV and back scattered electron scattered back by the irradiation electron are selected using the energy selecting aperture 208 to form an image. In this case, the objective lens 203, the first projective lens 205, the second projective lens 209 and the energy filter 207 are adjusted to an energy of the back scattered electrons.

Adjustment of an irradiating area of the irradiation electron beam 216 incident onto the sample 201 is adjusted by a second condenser lens 221 arranged in the electron gun 212. An electrostatic deflector 223 is arranged between a first condenser lens 228 and the second condenser lens 221. The electrostatic deflector 223 is controlled using a blanking control circuit 224 so as to perform switching on/off of irradiation to the sample 201 by the irradiation electron beam 216. By doing so, unnecessary irradiation of the sample 201 with the electron beam can be avoided, and accordingly damage of the sample 201 can be prevented.

Further, in a case where a semiconductor circuit as a sample 201 is driven, for example, by a power source connected to the external, a position of the sample 201 is changed by the driving frequency. In such a case, by pulsatively irradiating the sample 201 with the irradiation electron beam 216 in synchronism with the driving frequency, it is possible to observe the periodic operation as if the periodic operation did not exist (stroboscopic observation). The operation observed here is a voltage on a wiring. The energy filter 207 is also effective to detect the voltage. In a case where a semiconductor circuit 201 is not driven by an external power source but there exist voltages on the surface of the sample 201, the voltage distribution can be observed. For example, surface voltage depending on a material, voltage caused in a PN junction or the like can be observed.

An electrostatic deflector 220 placed between the electron gun 212 and the energy filter 207 is a deflector for adjusting the exciting electron beam 216 so as to pass through the first projective lens 205 and the objective lens 203.

The electron gun 212 is composed of an electron source 227, a Wehenelt cathode 226, an anode 225, a first condenser lens 228, a second condenser lens 221 and a limiting aperture 222. Although the electron source in this example is of a thermionic emission type, an electron source of a field emission type may be employed.

The deflector 229 is used for adjusting the secondary electron beam 218 so as to coincide with the axis of the first projective lens 205. The deflector 231 is also used for adjusting the secondary electron beam 218 passed through the energy filter 207 so as to coincide with the axis of the second projective lens 209. The positional relationship of the energy selecting aperture 208 and the deflector 231 may be reversed. Further, the deflector 230 is for adjusting the image-taking position of a projected image, and is used for automatic adjustment of a position to be inspected and observed. The deflector 236 is a deflector of a magnetic field and electrostatic field combined type, and can adjust the irradiation electron beam 216 and the secondary electron beam 218 independently. By canceling deflection by electrostatic field to the secondary electron beam 218 using deflection by magnetic field, an irradiating position of the exciting electron beam 216 to the sample 201 can be adjusted without affecting the secondary electron beam 218.

A voltage equal to the voltage applied to the sample 201 is also applied to a shield plate 234 arranged just above the sample 201. The shield plate 234 is effective when the voltage cannot be applied to the sample 201 because there is an insulating film on the reverse surface of the sample 201. This is based on the principle that voltage of an inside object surrounded by an identical voltage becomes equal to the identical voltage. Size (diameter) of an opening for letting an electron beam pass through in the shield plate 234 is 10 mm, and accordingly an effect of the opening on the electric field between the sample 201 and the objective lens 203 is small.

Figure 3:
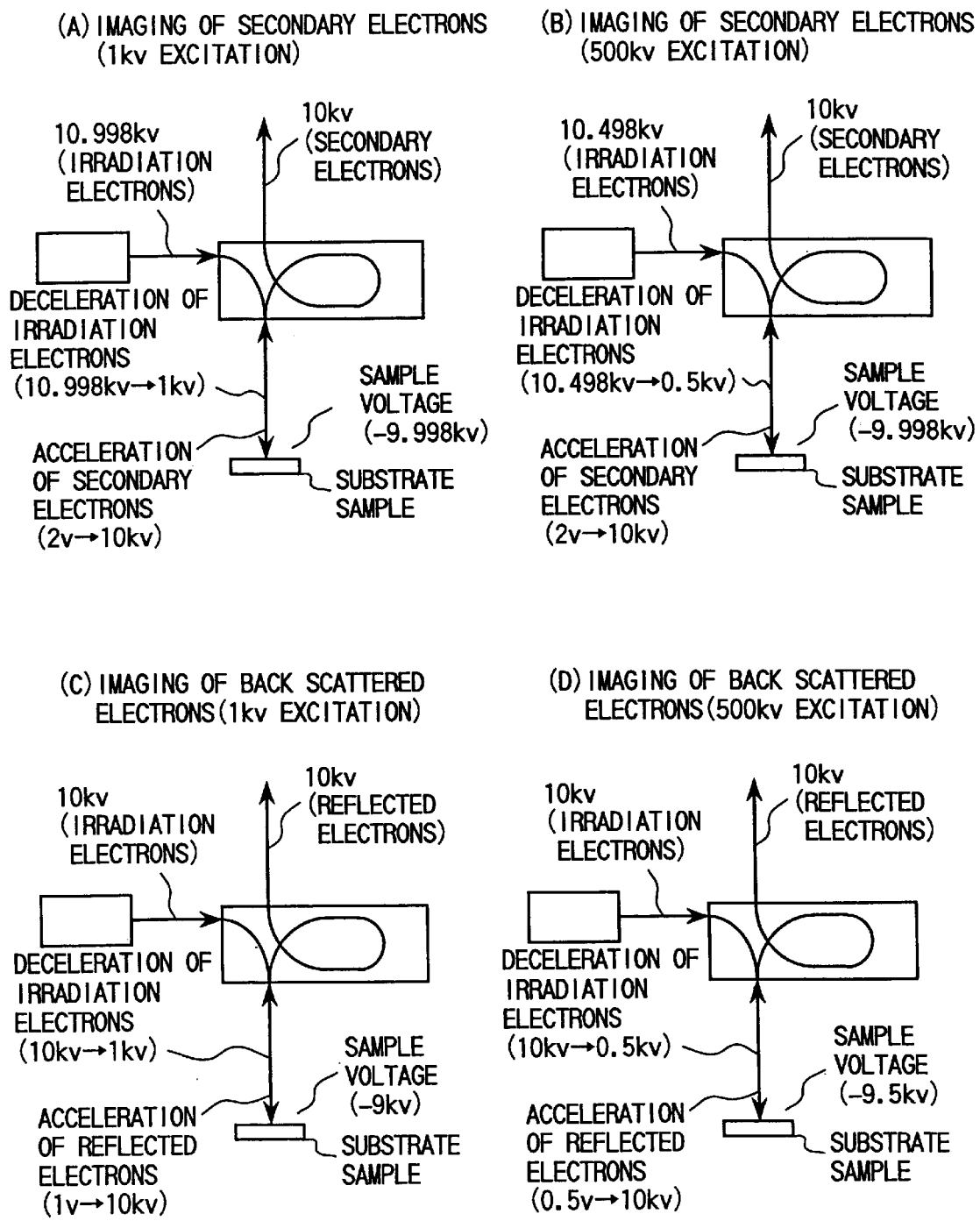
FIG. 3 (A) to FIG. 3 (D) are conceptual views showing cases where the embodiment of FIG. 2 is operated under various acceleration voltages.

FIG. 3 is conceptual views showing cases where the embodiment of FIG. 2 is operated under various acceleration voltages. FIGS. 3 (A) and (B) show examples of forming images by secondary electrons in cases where the acceleration voltages are 1 kV and 500 V, respectively. FIG. 3 (C) and (D) show examples of forming images by back scattered electrons in cases where the acceleration voltages are 1 kV and 500 V, respectively. In this embodiment, the intensity (exciting intensity) of the energy filter is kept constant. That is, the magnetic field intensity of the energy filter is adjusted so that only electrons having an energy of 10 kV pass through the energy filter.

In the case where the secondary electron image is observed in setting the acceleration voltage to 1 kV, the irradiation electrons of 10.998 kV are irradiated onto the sample applied with −9.998 kV, as shown in FIG. 3 (A). The irradiation electrons of 10.998 kV are decelerated by the sample voltage of −9.998 kV, and irradiated with 1 kV onto the sample. On the contrary, secondary electrons of 2 eV among electrons produced on the sample is accelerated by the voltage of 9.998 kV to pass through the energy filter having an energy of 10 kV. The accelerated secondary electrons are magnified and projected to be image taken. In the case where the secondary electron image is observed in setting the acceleration voltage to 500 V, the acceleration voltage of the irradiation electrons is set to 10.498 kV, as shown in FIG. 3 (B).

In the case where the back scattered electron image is observed in setting the acceleration voltage to 1 kV, the energy of the irradiation electrons of 10.998 kV is set to 10 kV and a voltage of −9 kV is applied to the sample, as shown in FIG. 3 (C). On the contrary, the back scattered electrons of 1 kV back scattered by the sample are accelerated to 10 kV by the deceleration voltage, and pass through the energy filter. In the case where the back scattered electron image is observed in setting the acceleration voltage to 500 V, the energy of exciting electrons is set to 9.5 kV, as shown in FIG. 3 (D). Therein, since the exciting intensity of the energy filter is fixed so as to allow only electrons of 10 kV pass through, a function to make the irradiation electrons having varied energies coincide with an axis is required.

Figure 4:
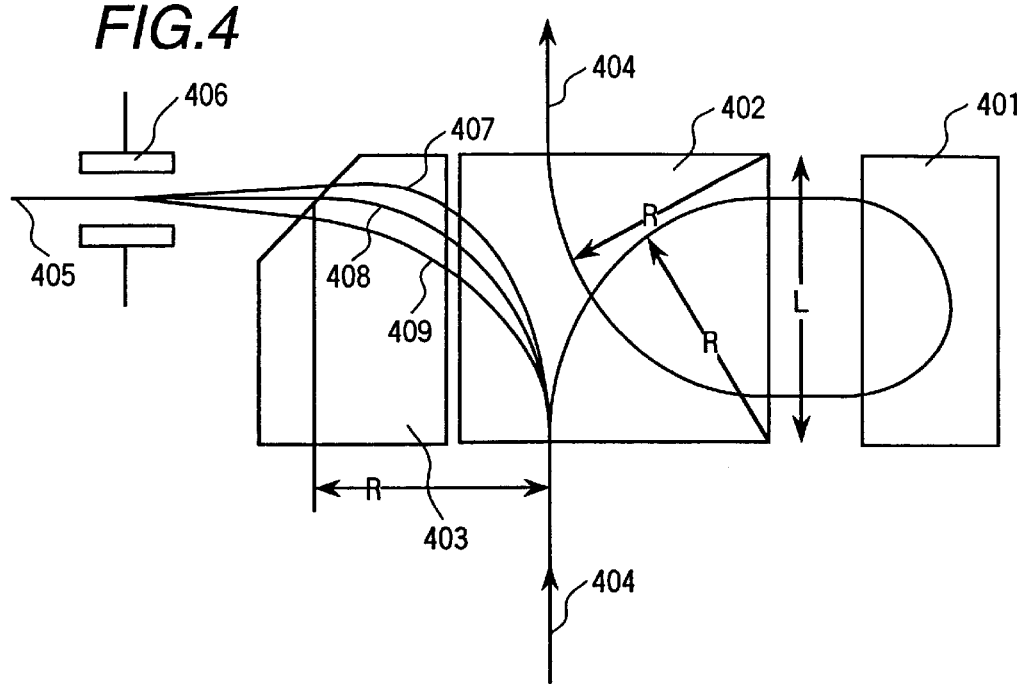
FIG. 4 is a view showing an example of the structure of an energy filter which can cope with variation of acceleration voltage of the irradiation electrons in the embodiment of FIG. 2.

FIG. 4 shows an example of the structure of an energy filter which can cope with variation of acceleration voltage of the irradiation electrons. This energy filter is composed of a first magnetic pole 401, a second magnetic pole 402 and a third magnetic pole 403. A uniform magnetic field perpendicular to the plane of the figure is formed inside each of the magnetic poles. The second magnetic pole 402 turns the electron beam 404 of 10 kV entering from downward clockwise with a radius R. The electron beam leaves from the second magnetic pole 402 when the electron beam is turned 90 degrees, and enters into the first magnetic pole 401. The electron beam is turned 180 degrees with a radius R2 in the first magnetic pole 401, and returned to the second magnetic pole 402. The radius R2 can, be calculated by an equation of (R-L/2). Therein, L is the length of the second magnetic pole in an incident direction of the electron beam 404 to the second magnetic pole 402. The electron beam returned to the second magnetic pole 402 is again turned with the radius R, and leaves from a position of the second magnetic pole 402 on an extension of the incident line of the electron beam.

Incidence of the irradiation electron beam 405 will be described below. The acceleration voltages of the irradiation electrons are within a range of 9.5 kV to 11 kV. The irradiation electrons having acceleration voltages within the range must be made coincide with the center axis of the first projective lens 205 and the objective lens 203 of FIG. 2. Initially, a case of 10 kV will be considered. In this case, an equal intensity magnetic field is applied to the third magnetic pole 403 and the second magnetic pole 402. The irradiation electrons 408 of 10 kV are turned with a radius R, and travel downward along the same axis as the electron beam 404 to irradiate the sample. In a case where energy of the irradiation electrons is larger than 10 kv, the radius of rotation in the second magnetic pole 402 becomes larger than R (407). Therefore, by making the intensity of the magnetic field of the third magnetic pole 403 stronger and deflecting the irradiation electron beam upward using the deflector 406, a path 407 is formed so that the irradiation electron beam having an energy larger than 10 kV is made coincide with the electron beam 404. In detail, the adjusting method is that the magnetic field of the third magnetic pole 403 is slowly varied while the deflector 406 is vertically deflecting at a high speed. The path can be easily found by this operation. In a case where the energy of the exciting electron is low, the electron beam passes along a path 409. In this case, the path can be adjusted by the similar method.

Figure 5:
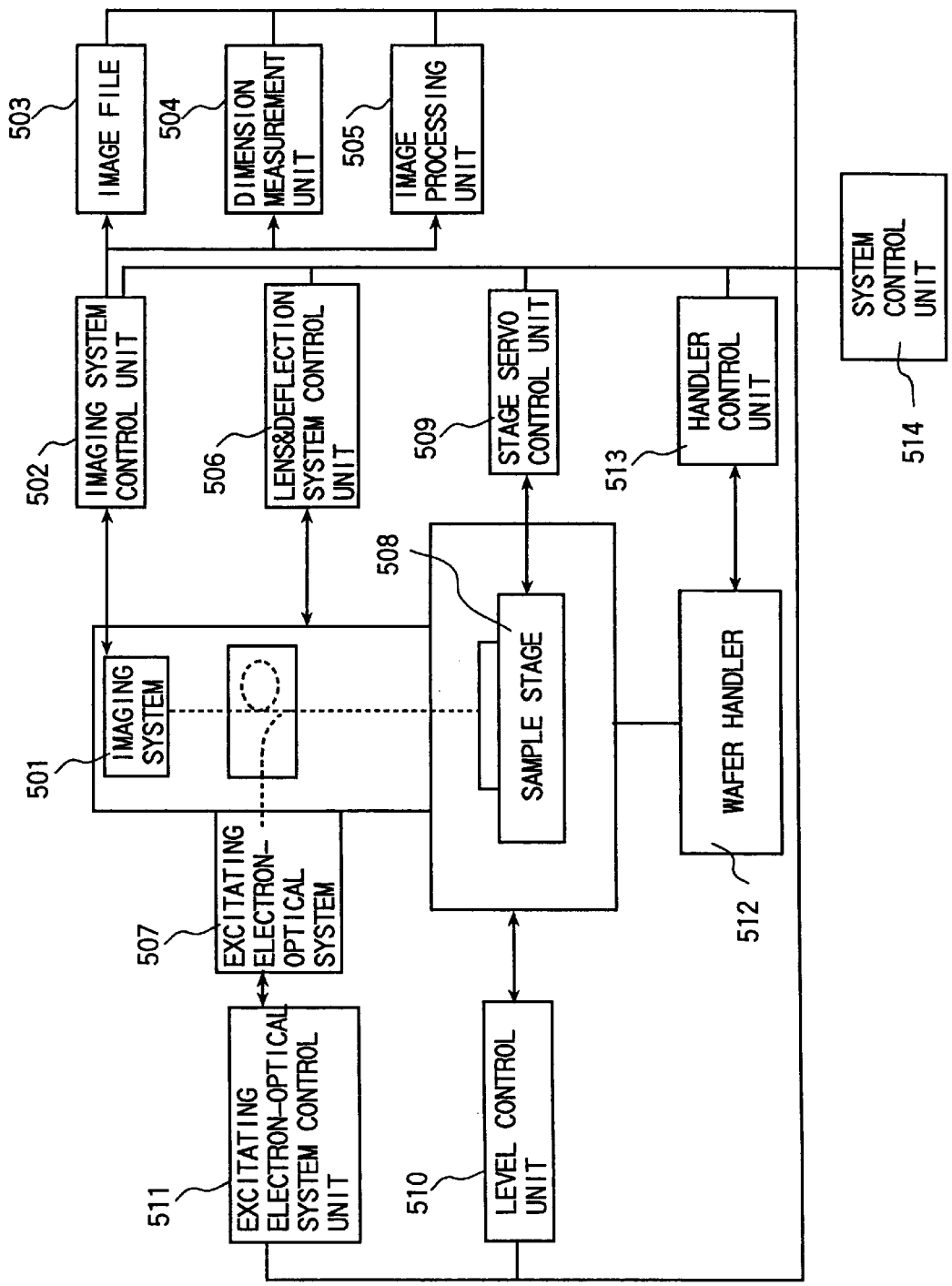
FIG. 5 is a conceptual block diagram showing an embodiment in a case where the present invention is applied to dimension evaluation in a semiconductor process.

FIG. 5 shows an embodiment in a case where the present invention is applied to dimension evaluation in a semiconductor process.

In FIG. 5, the electron-optical system shown in FIG. 2 is employed, and accordingly the illustration of that portion is omitted. An object to be inspected (sample) is a substrate of semiconductor wafer. An imaging system 501 is controlled by an imaging system control unit 502, and a two-dimensional image projected to the imaging system 501 is acquired. The acquired two-dimensional image is recorded in an image file 503. The recorded two-dimensional image is sequentially transmitted to a dimension measurement unit 504 to execute measurement of wiring width or hole diameter. Generally, the measurement is performed through a threshold method using a line profile. Further, in a case of a complex shape, a method of comparing with a reference area or a method of comparing with a design shape is employed. In an image processing unit 505, image processing such as contrast enhancement of the two-dimensional image or output of automatic focusing information by Fourier transform or two-dimensional image pattern recognition for confirming a measuring position is executed.

A lens and deflection system control unit 506 controls the lenses and the deflection systems the energy analyzer (filter) for projecting the back scattered electrons and the secondary electrons from the sample to form an image. A stage servo control unit 509 controls a sample stage 508. Determination and control of a position of the stage are performed using a linear sensor or a laser micrometer with an accuracy in the order of a micrometer or smaller. Piezoelectric elements are incorporated in the stage 508 to change the level of the sample. The level control unit 510 performs automatic focusing by combining with focusing by Fourier transform of the image processing unit 505. An exciting electron-optical system 507 is controlled by an exciting electron-optical system control unit 511. Therein, control of the lenses and the deflection system, energy setting of the irradiation electrons and control of voltage applying to the sample are performed.

Mounting of a wafer to the stage 508 is performed through a plurality of auxiliary vacuum chambers, not shown. For example, in a system having two stages of auxiliary vacuum chamber, a sample is introduced into a sample chamber through a first auxiliary vacuum chamber evacuated up to approximately $10^{-2}$ Torr and then through a second auxiliary vacuum chamber evacuated up to approximately $10^{-4}$ Torr. When the sample 201 is mounted on the sample stage in the sample chamber, the negative voltage applied to the sample holder 233 is switched off in advance. This control is performed through a sequential operation such as interlocking of opening and closing of a gate valve arranged between the sample chamber and the auxiliary vacuum chamber. Transferring of the wafer is performed using a wafer handler 512 which is controlled by a handler control unit 513. All of the control units, the image file 503, the dimension measurement unit 504 and the image processing unit 505 are controlled by a computer in a system control unit 514. The computer not only stores operating conditions of the apparatus, but also instructs positions to be measured, order of measuring, data management and so on when measurement is performed.

Figure 6:
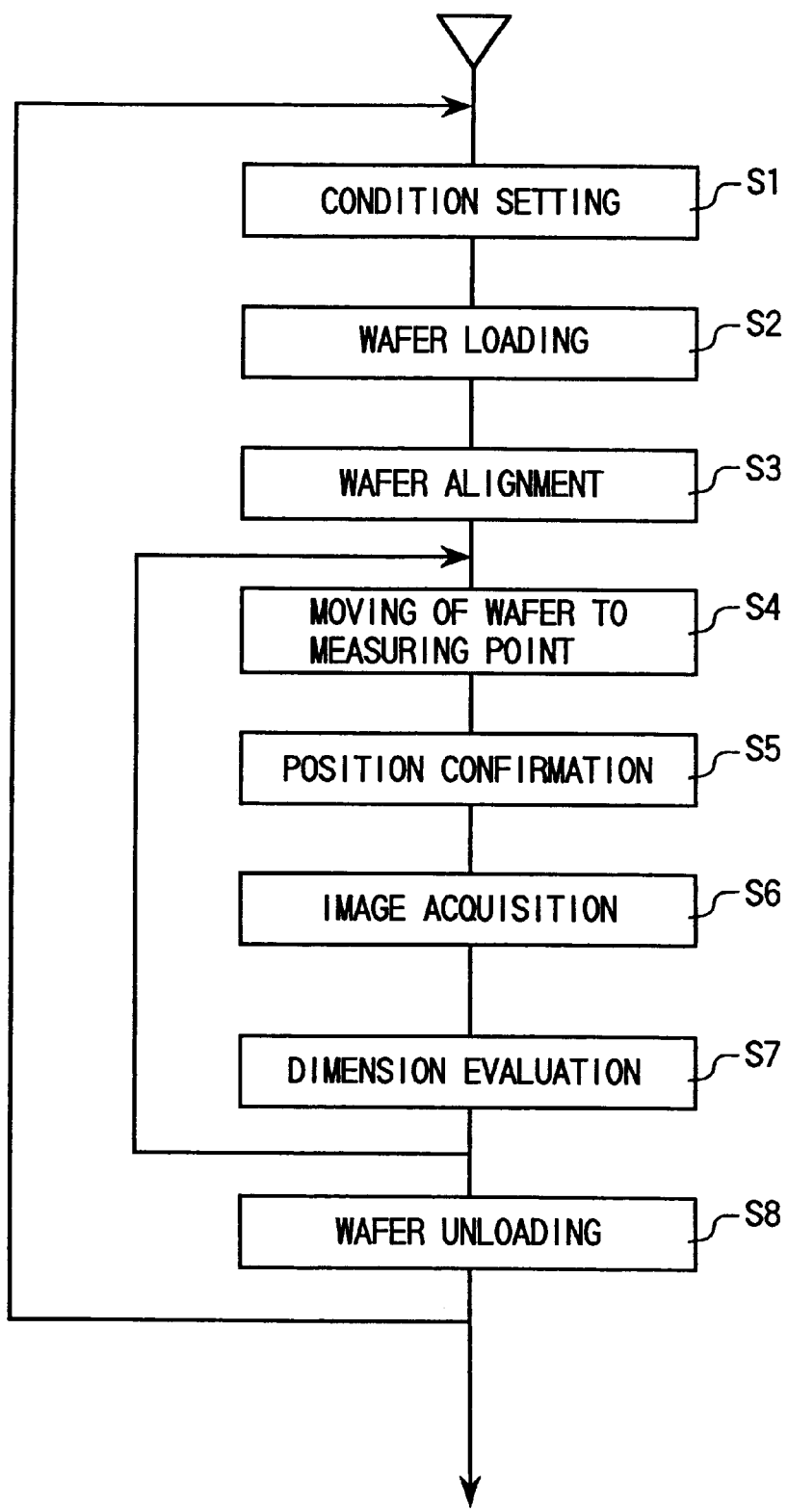
FIG. 6 is a chart showing the execution flow when dimension measurement is performed using the embodiment of FIG. 5.

FIG. 6 is a chart showing the execution flow when dimension measurement is performed using the embodiment of FIG. 5. Initially, setting of conditions such as setting of an irradiation electron voltage, setting of an image-taking time, setting of a kind of image-forming electron (secondary electron/back scattered electron), setting of positions to be observed, setting of a measuring magnification and so on are performed (S1). These optical conditions are pre-adjusted, and set values for each of the elements are stored in the computer. After completion of the setting of conditions, a wafer is mounted on the stage (S2). That is, the wafer contained in a cassette is extracted using a robot hand, and moved to the first auxiliary vacuum chamber to be loaded. In general, an orientation flat position of the wafer is detected during this transfer process, and accordingly the wafer is always set in an identical direction. Then, the wafer is mounted and evacuation is performed. Next, the wafer is transferred to the second auxiliary vacuum chamber which is evacuated to a higher vacuum. After that, the gate (air-lock valve) between the sample chamber and the second auxiliary vacuum chamber is opened, and the wafer in the auxiliary chamber is mounted on the stage in the sample chamber. This transfer is also performed by a robot hand. By providing two lines of the auxiliary vacuum chambers, the required time evacuating the auxiliary vacuum chamber for the wafer can be shortened. In this case, while a wafer mounted on the stage is being inspected, the auxiliary vacuum chamber for another wafer to be inspected next in one of the lines is evacuated. By this method, the throughput of inspection can be substantially improved.

Next, alignment of wafer is performed (S3). This is to perform positional correction of the wafer mounted on the stage by observing two markers marked at specific positions on the wafer. There are some cases that the alignment is performed using an optical microscopic image in prior to correction using an electron projective image. The optical microscope is not necessary to be in the same optical axis as the electron microscope. In this case, correction of the relative position is performed. The wafer is mounted on the stage positionally reproducibly, but the position is not perfectly reproduced. This displacement is measured and the value is fed back to the stage position control to correct the positional displacement. Although the specific markers is used for alignment in the above description, a pattern formed on the wafer may be used instead. Correction using two positions of markers can correct rotational displacement of the wafer.

After completion of the wafer alignment, the stage is moved so that pre-registered measured positions are successively positioned under the optical axis, and the positions are confirmed (S4, S5). Since the position of the stage is optically positioned (measured using the laser micrometer), the stage is stopped with an accuracy below several micrometers. In a case where an accuracy lower than the above is required, a position to be measured (a desired position) and the surrounding image are pre-registered in the memory, and the position to be measured is automatically positioned to the center of the image through recognition of the pattern in connection with the registered image. The positioning is performed by moving the stage and using the X- and Y-direction deflector 230 of FIG. 2. Further, in a case where a position to be measured exists within an observing image, the position making a profile to perform dimension measurement may be moved.

Next, an image for measurement is acquired (S6). That is, focusing is performed. The focusing is performed by two steps of coarse adjustment through an optical method in which laser light is obliquely irradiated (a method of using electrostatic capacitance may be acceptable) and final adjustment through image processing in which a current value of the objective lens to make a high frequency component in the image maximum is selected by finely adjusting the current of the objective lens.

Next, using the acquired image, measurement with a specified spacing is performed (S7). Not only wiring widths and hole diameters are measured, but also areas are calculated.

After completion of measurements of a plurality of specified positions, the wafer is transferred from the stage to the auxiliary chamber, and the auxiliary chamber is brought to atmospheric pressure after closing the gate (air lock valve), and thus the wafer is returned to the cassette to complete the measurement (S8). When the measurement is continued, the next wafer is transferred to the auxiliary chamber.

An example of performing wafer shape inspection using the embodiment of FIG. 5 will be described below. In the dimension measurement, a typical example is that five chips in a wafer are selected, and five positions in each of the chips are measured, that is, total of twenty-five positions are measured. This is exactly partial inspection. On the other hand, in the shape inspection, inspection is, however, performed on shapes over the whole surface. Therefore, the shape inspection using the embodiment of FIG. 5 is different from the dimension measurement using the embodiment of FIG. 5 in the following three points. That is, (1) in order to improve the throughput, the stage is continuously moved and data is acquired during the moving process. (2) As the stage is continuously moved, one-dimensional image-taking devices are used in the image-taking unit (a plurality of one-dimensional image-taking devices are often used in order to improve the S/N ratio). (3) Identical patterns in a wafer is compared with each other in order to judge whether a shape is normal or not (a method of comparing chips with each other or a method of comparing memory cells with each other is employed).

Figure 7:
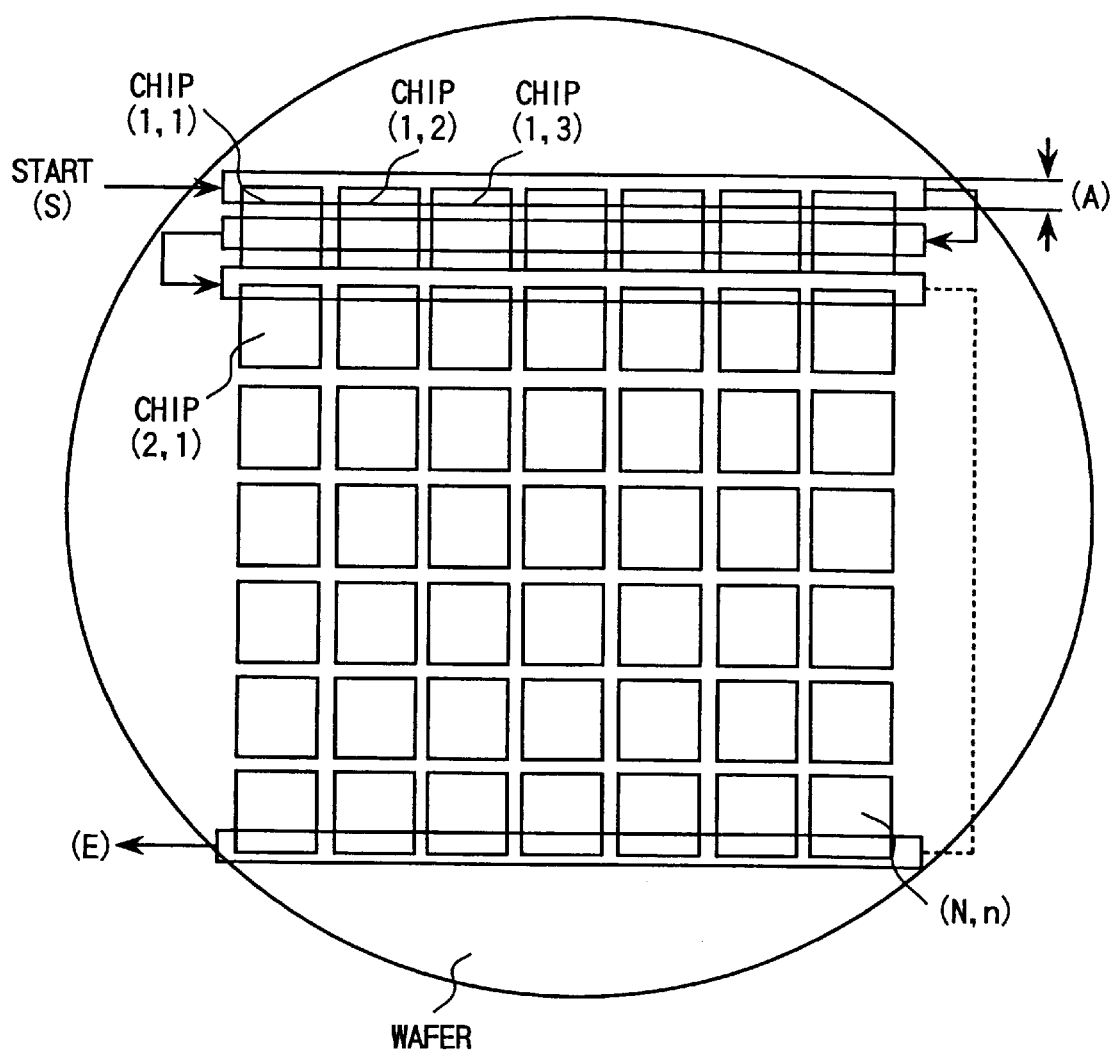
FIG. 7 is a view explaining a state in which a substrate made of a wafer as a sample is inspected while the sample stage is continuously being moved in the embodiment of FIG. 5.

FIG. 7 is a view explaining a state in which a substrate made of a wafer as a sample is inspected while the sample stage is continuously being moved. N×n chips are arrayed in the wafer. The stage is scanned to and fro starting from (S) and ending at (E) so as to include all the chips. Although the figure is illustrated as if the observing area were moving, the observing area is stopped and the sample stage, that is, the wafer is moved. The spacing shown by (A) is a width capable of being observed by once of scanning. This width is determined by observation resolution or definition of the one-dimensional device. In general, the width is determined so as to have several % of overlapping. By scanning once over the whole surface, an image of the whole surface of the wafer can be made. Fluctuation in scanning speed of the stage and non-linearity of the scanning are measured by a laser position measure incorporated in the stage, and corrected by feeding back the difference from the set values to the electron beam deflector (230 in FIG. 2). In regard to the comparison between the chips, for example, data (image) of the chip (1, 1) is stored, and compared with the chip (1, 2) to detect the difference between them. Next, data of the chip (1, 2) is compared with the chip (1, 3). If difference is detected in an identical position, it is judge that the chip (1, 2) has a shape defect. For convenience of explanation, it has been described above that the comparison is made on the image of the whole chip at a time. However, it is acceptable that the comparison is made on an observed area in the chip. It is possible to prevent the memory capacity from increasing by successively erasing the data.

Figure 8:
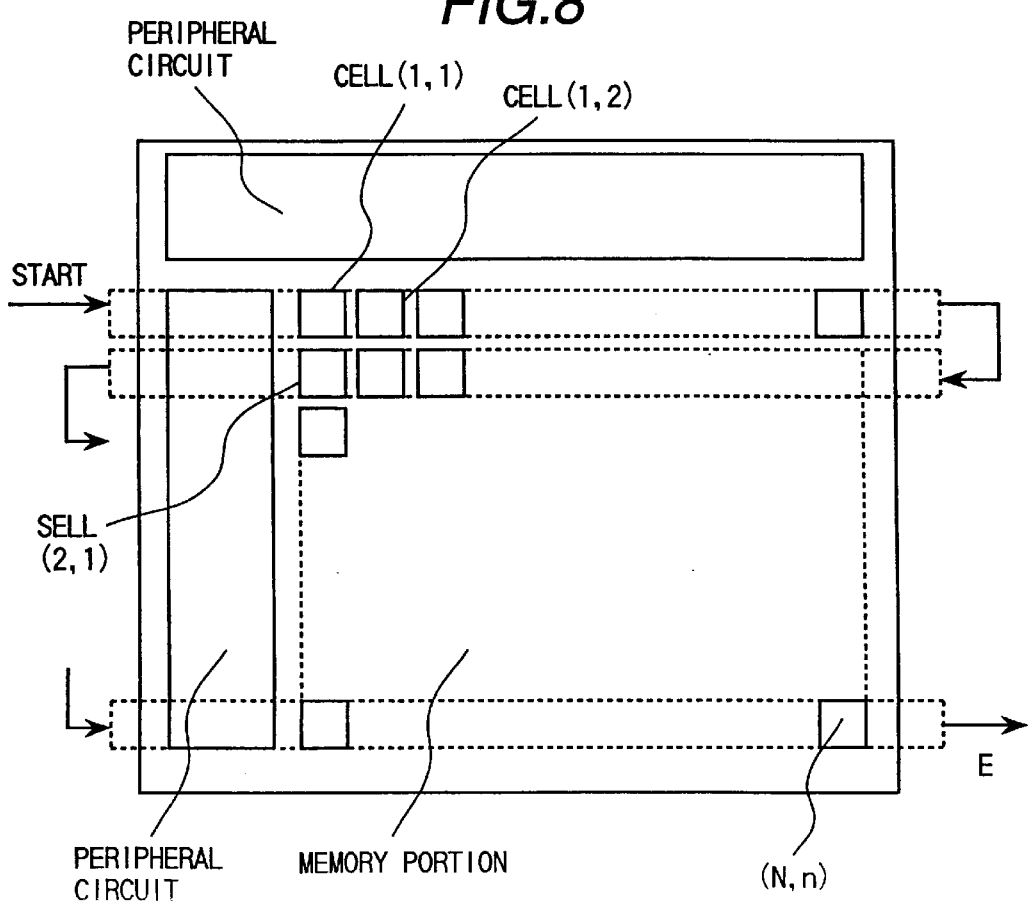
FIG. 8 is a view explaining cell comparison in which inspection is performed using the same shape in a chip in the embodiment of FIG. 5.

FIG. 8 is a view explaining cell comparison in which inspection is performed using the same shape in a chip. This method is used for a memory portion where memory cells having an identical shape are arrayed. Although the inspection of wafer shape is performed using one one-dimensional image-taking device, it is possible to improve the S/N ratio and, as a result, to improve the throughput by employing a plurality of one-dimensional image-taking devices. Further, although the sample stage movable in X- and Y-directions is continuously moved in the above-mentioned embodiments, it is acceptable to employ a sample stage of an r–θ type, that is, of a polar-coordinate type in which rotation and uni-axial movement are combined.

According to the embodiment of the present invention, it is possible to attain a high throughput which has been unable to be attained by dimension measurement or substrate inspection using the conventional electron beam scanning method. That is, inspection of the whole surface over one wafer requires, for example, 10 hours by the conventional scanning method can be performed within several minutes by employing the embodiment of the present invention.

According to the present invention, it is possible to provide the projecting type charged particle microscope and the projecting type substrate inspection system which are suitable for improving the throughput.

What is claimed is:

1. A projecting type charged particle microscope, comprising:

a charged particle gun for emitting a charged particle beam, an energy filter for deflecting the charged particle beam to direct said beam to a sample and energy-dispersing the charged particle beam, a first projective lens arranged between the sample and the energy filter for projecting the charged particle beam on the sample to emit charged particles therefrom and focusing and making the charged particles incident on the energy filter, and a second projective lens for projecting the energy-dispersed charged particles on a plane, an imager arranged in the plane for imaging the charged particles projected by the second projective lens, the first projective lens, the energy filter and the second projective lens being stacked and arranged in a direction substantially perpendicular to a surface of the sample.

2. A projecting type charged particle microscope according to claim 1, which comprises means for selecting an energy of said charged particles, said image-formed charged particle image being formed with said charged particles having the energy selected by said means.

3. A projecting type charged particle microscope according to claim 2, which comprises electric field generating means for generating an electric field on the surface of said substrate to accelerate said charged particles.

4. A projecting type charged particle microscope according to claim 2, wherein said charged particles comprise electrons, said projecting-and-image-forming means comprising a magnetic field type electron lens system, said energy selecting means being of magnetic field type.

5. A projecting type charged particle microscope according to claim 2, wherein said charged particles comprise secondary electrons and back scatted electrons, said energy selecting means selecting any one kind of said secondary electrons and said back scattered electrons.

6. A projecting type charged particle microscope according to claim 2, which comprises a deflector, wherein said projecting-and-image-forming means comprises a first straight axis to let said charged particles pass along, said irradiating means comprising a second axis intersecting with said first axis at right angle, said irradiating beam passing along said second axis, said deflector deflect said irradiating beam so that said irradiating beam passing along said second axis irradiates said substrate with passing along said first axis.

7. A projecting type charged particle microscope according to claim 6, wherein said energy selecting means comprises a magnetic field type energy filter, said energy filter also serving as said deflecting means.

8. A projecting type charged particle microscope according to claim 2, which comprises means for maintaining the surface of said s ubstrate in a negative electric potential so as to accelerate said charged particles, wherein said projecting-and-image-forming means comprises a magnetic field type objective lens, and said energy selecting means is of magnetic field type, an energy of said charged particles to be image-formed being selected by changing the accelerating voltage of said irradiating beam and said negative electric potential under a condition that operating conditions of said objective lens and said energy selecting means are fixed, respectively.

9. A projecting type charged particle microscope according to claim 8, which comprises magnetic field type deflecting means and electrostatic type deflecting means between said substrate and said objective lens.

10. A projecting type substrate inspection system comprising:

a charged particle gun for emitting a charged particle beam, an energy filter for deflecting the charged particle beam to direct said beam to a sample and energy-dispersing the charged particle beam, a first projective lens arranged between the sample and the energy filter for projecting the charged particle beam on the sample to emit charged particles therefrom and focusing and making the charged particles incident on the energy filter, a second projective lens for projecting the energy-dispersed charged particles on a plane, an imager arranged in the plane for imaging the charged particles projected by the second projective lens, the first projective lens, the energy filter and the second projective lens being stacked and arranged in a direction substantially perpendicular to a surface of the sample, and means for performing alignment of said substrate.

11. A projecting type substrate inspection system according to claim 10, which comprises means for selecting an energy of said charged particles, thereby said image-formed charged particle image being formed with said charged particles having the selected energy.

12. A projecting type substrate inspection system according to claim 11, wherein said means for performing alignment comprises alignment executing means using an optical microscope and alignment executing means using said image-taken projected image.

13. A projecting type substrate inspection system according to claim 11, which comprises an auxiliary chamber which receives a substrate to be irradiated by said irradiating beam next and is evacuated while the precedent substrate is being irradiated by said irradiating beam.

14. A projecting type substrate inspection system according to claim 11, which comprises means for determining a desired position on said substrate by measuring a position of said substrate and coinciding said determined position with the position to be irradiated with said irradiating beam.

15. A projecting type substrate inspection system according to claim 11, which comprises a deflector, wherein said projecting-and-image-forming means comprises a final projecting lens for projecting charged particles having said selected energy, said deflector being arranged between said final projecting lens and said image-taking means so as to adjust a position of said charged particles to be projected.

16. A projecting type substrate inspection system according to claim 11, wherein said alignment means automatically perform alignment of said substrate using an image pattern of said substrate.

17. A projecting type substrate inspection system according to claim 11, wherein said alignment means comprises recognizing means for automatically aligning said substrate.

18. A projecting type substrate inspection system according to claim 11, which comprises a memory for pre-storing an image of said substrate, said alignment means using said pre-stored image in order to automatically align said substrate.

19. A projecting type substrate inspection system according to claim 11, which comprises:
   means for storing an output of said image-taking means; and
   means for comparing images at an identical pattern position in said substrates with each other to detect difference in the pattern.

20. A projecting type substrate inspection system comprising:
   a charged particle gun for emitting a charged particle beam;
   an energy filter for deflecting the charged particle beam to direct said beam to a sample and energy-dispersing the charged particle beam;
   a first projective lens arranged between the sample and the energy filter for projecting the charged particle beam on the sample to emit charged particles therefrom and focusing and making the charged particles incident on the energy filter; and
   a second projective lens for projecting the energy-dispersed charged particles on a plane, an imager arranged in the plane for imaging the charged particles projected by the second projective lens, the first projective lens, the energy filter and the second projective lens being stacked and arranged in a direction substantially perpendicular to a surface of the sample; and
   a laser micrometer for determining a position of said substrate in connection with said irradiation beam.

21. A projecting type substrate inspection system according to claim 20, which comprises means for selecting an energy of said charged particles, thereby said image-formed charged particle image being formed with said charged particles having the selected energy.

22. A projecting type substrate inspection system according to claim 21, which comprises means for continuously moving said substrate during image taking by said image-taking means.

23. A projecting type substrate inspection system according to claim 21, which comprises means for determining a desired position on said substrate in connection with said image-taking means by measuring a position of said substrate and deflecting said charged particles to be projected to said determined desired position.

24. A projecting type substrate inspection system according to claim 23, which comprises means for recording a projected image of said desired position of the substrate image taken by said image-taking means.

25. A projecting type substrate inspection system according to claim 21, which comprises means for pre-storing an image of said substrate, an image-taken image of said substrate being compared with said pre-stored image.

26. A projecting type substrate inspection system according to claim 21, which comprises a polar coordinate type stage which holds said substrate and continuously moves and continuously rotates said substrate during image taking using said image-taking means.

27. A projecting type charged particle microscope, comprising:
   a particle gun for emitting a charged particle beam,
   an energy filter comprising first and second magnetic pole pieces, the first magnetic pole piece deflecting the charged particle beam to direct said beam to a sample as to emit charged particles therefrom and deflecting at least the charged particles in arc form, and the second magnetic pole piece deflecting the charged particles emitted from the sample to direct the same to the first magnetic pole piece and deflecting the charged particles deflected by the first magnetic pole piece to direct the same in the direction opposite to that which the first magnetic pole piece directs the beam to the sample,
   a first projective lens arranged between the sample and the energy filter for projecting the charged particle beam on the sample and focusing and making the charged particles incident on the energy filter,
   a second projective lens for projecting the charged particles deflected by the energy filter on a plane, and
   an imager for imaging the charged particles projected by the second projective lens.

* * * * *